(12) United States Patent
Yamane et al.

(10) Patent No.: US 8,879,315 B2
(45) Date of Patent: Nov. 4, 2014

(54) STORAGE ELEMENT AND STORAGE DEVICE

(75) Inventors: Kazutaka Yamane, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP); Tetsuya Asayama, Tokyo (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 111 days.

(21) Appl. No.: 13/560,708

(22) Filed: Jul. 27, 2012

(65) Prior Publication Data

US 2013/0033931 A1   Feb. 7, 2013

(30) Foreign Application Priority Data

Aug. 3, 2011   (JP) .................................. 2011-169867

(51) Int. Cl.
| | |
|---|---|
| G11C 11/14 | (2006.01) |
| H01L 43/10 | (2006.01) |
| G11C 11/16 | (2006.01) |
| H01F 10/32 | (2006.01) |
| H01L 27/22 | (2006.01) |

(52) U.S. Cl.
CPC ............ *H01F 10/3286* (2013.01); *H01L 43/10* (2013.01); *G11C 11/161* (2013.01); *H01L 27/228* (2013.01); *H01F 10/329* (2013.01); *G11C 11/1675* (2013.01)
USPC ............ 365/171; 365/158; 365/173; 365/157

(58) Field of Classification Search
CPC ...... H01L 43/08; H01L 27/222; G11C 11/16; G11C 19/0808; G11B 2005/3996; G11B 5/3903; G11B 5/3906; G11B 5/3909
USPC .......................... 365/158, 171, 173, 145, 157
See application file for complete search history.

(56) References Cited

U.S. PATENT DOCUMENTS

| | | | |
|---|---|---|---|
| 6,256,223 B1 | 7/2001 | Sun | |
| 7,480,173 B2 * | 1/2009 | Guo et al. | ...... 365/158 |
| 2011/0049659 A1 * | 3/2011 | Suzuki et al. | ......... 257/421 |

FOREIGN PATENT DOCUMENTS

| | | |
|---|---|---|
| JP | 2003-017782 | 1/2003 |
| JP | 2008-227388 | 9/2008 |

OTHER PUBLICATIONS

J.C. Slonczewski, "Letter to the Editor, Current-driven excitation of magnetic multilayers," Journal of Magnetism and Magnetic Materials, 159 (1996) pp. L1-L7, Received Oct. 27, 1995; revised Dec. 19, 1995. (7 pages).

(Continued)

*Primary Examiner* — Thong Q Le
(74) *Attorney, Agent, or Firm* — K&L Gates LLP

(57) ABSTRACT

Provided is a storage element including a storage layer that holds information according to a magnetization state of a magnetic body, a magnetization fixing layer that has magnetization serving as a reference of the information stored in the storage layer, and an insulation layer that is formed of a non-magnetic body disposed between the storage layer and the magnetization fixing layer. The information is stored by reversing the magnetization of the storage layer using spin torque magnetization reversal occurring with a current flowing in a lamination direction of a layer configuration of the storage layer, the insulation layer, and the magnetization fixing layer, and a size of the storage layer is less than a size in which a direction of the magnetization is simultaneously changed.

7 Claims, 8 Drawing Sheets

(56) References Cited

OTHER PUBLICATIONS

Mangin et al., "Current-inducedmagnetization reversal in nanopillars with perpendicular anisotropy," Nature Materials, vol. 5, Mar. 2006, pp. 210-215, Published online Feb. 19, 2006. (6 pages).

L. Berger, "Emission of spin waves by a magnetic multilayer traversed by a current," The American Physical Society, Physical Review B, vol. 54, No. 13, Oct. 1, 1996, pp. 9353-9358. (6 pages).

C.J. Lin et al., "45nm Low Power CMOS Logic Compatible Embedded STT MRAM Utilizing a Reverse-Connection 1T/1MTJ Cell," IEEE, 2009. (4 pages).

* cited by examiner

STORAGE ELEMENT AND STORAGE DEVICE

CROSS REFERENCES TO RELATED APPLICATIONS

The present application claims priority to Japanese Priority Patent Application JP 2011-169867 filed in the Japan Patent Office on Aug. 3, 2011, the entire content of which is hereby incorporated by reference.

BACKGROUND

The present disclosure relates to a storage element that includes a storage layer storing a magnetization state of a ferromagnetic layer as information and a magnetization fixing layer in which the direction of magnetization is fixed and the direction of the magnetization of the storage layer is changed by causing a current to flow, and a storage device including the storage element.

With rapid development of various information apparatuses such as mobile terminals and large-capacity servers, new high performance features such as high integration, high speed, and low power consumption have been studied on elements such as memories or logic circuits included in various information apparatuses. In particular, semiconductor non-volatile memories have been highly advanced and flash memories such as high-capacity file memories have been proliferated as hard disk drives. On the other hand, development of ferroelectric random access memories (FeRAMs), magnetic random access memories (MRAMs), phase-change random access memories (PCRAMs), and the like is in progress to develop these memories to code storages or working memories and to substitute the currently available NOR flash memories or DRAMs. Moreover, some of the memories have already been put to practical use.

Of the memories, MRAMs are capable of rewriting data rapidly and almost infinitely (more than $10^{15}$ times) because data is stored according to a direction of magnetization of a magnetic body, and have already been used in fields of industry automation, airplanes, or the like. MRAMs are expected to be developed into code storages or working memories in the future in terms of a high speed operation and reliability. In reality, difficulties of low power consumption and large capacity have become a problem. This problem is an inherent problem with a recording principle of MRAMs, that is, a method of causing a current to flow in two kinds of address lines (a word line and a bit line) substantially perpendicular to one another and recording information by reversing the magnetization of a magnetic layer of a magnetic storage element at an intersection of the address lines using a current magnetic field generated from each address line, that is, reversing the magnetization using the current magnetic field generated from each address line.

As one of the solutions to this problem, recording types performed without dependency on the current magnetic field, that is, magnetization reversing types, have been examined. Of these types, studies on spin torque magnetization reversal have actively been made (for example, see Japanese Unexamined Patent Application Publication No. 2003-17782, U.S. Pat. No. 6,256,223, Japanese Unexamined Patent Application Publication No. 2008-227388, PHYs. Rev. B, 54.9353 (1996), and J. Magn. Mat., 159, L1 (1996)).

The spin torque magnetization reversal type storage elements are configured by a magnetic tunnel junction (MTJ), as in MRAMs, in many cases. In such a configuration, a free magnetic layer is reversed when a current with a value equal to or greater than a given threshold is caused to flow by applying a torque (which is called a spin transfer torque) to a magnetic layer when spin-polarized electrons passing through the magnetic layer fixed in a given direction enter another free magnetic layer (in which a direction is not fixed). Rewriting "0/1" is performed by changing the polarity of the current.

An absolute value of the current used to reverse the magnetic layer is 1 mA or less in an element with a scale of about 0.1 μm. Further, scaling can be performed to decrease the current value in proportion to an element volume. Furthermore, there is an advantage of simplifying a cell structure, since a recording current magnetic field generation word line, which is necessary in MRAMs, is not necessary.

Hereinafter, an MRAM using spin torque magnetization reversal is referred to as a spin torque-magnetic random access memory (ST-MRAM). The spin torque magnetization reversal is also referred to as spin injection magnetization reversal. An ST-RAM is highly expected to be realized as a non-volatile memory that has the advantages of low power consumption and large capacity in addition to the advantages of an MRAM in which data is rewritten rapidly and almost infinitely.

SUMMARY

In MRAMs, a writing line (a word line or a bit line) is provided separately from a storage element and information is written (recorded) using a current magnetic field generated by causing a current to flow in the writing line. Therefore, a sufficient amount of current necessary for writing the information can flow in the writing line.

On the other hand, in an ST-MRAM, it is necessary to reverse the direction of the magnetization of the storage layer by performing the spin torque magnetization reversal by the current flowing in the storage element. Since information is written (recorded) by causing a current to flow directly to the storage element, the storage device includes a storage element and a selection transistor connected to one another to select a storage device writing information. In this case, the current flowing in the storage element is restricted by the magnitude of the current (the saturated current of the selection transistor) that can flow in the selection transistor.

Further, since an ST-MRAM is a non-voltage memory, it is necessary to stably store information written using the current. That is, it is necessary to ensure stability (thermal stability) against thermal fluctuation of the magnetization of the storage layer.

When the thermal stability of the storage layer is not ensured, the reversed direction of the magnetization may be reversed again due to heat (temperature in an operation environment). Therefore, a writing error may be caused.

In the storage element of the ST-MRAM, the advantage of the scaling, that is, the advantage of reducing the volume of the storage layer, can be obtained compared to an MRAM according to the related art, as described above.

However, when the volume of the storage layer is reduced, the thermal stability has a tendency to deteriorate under the same conditions of the other characteristics.

In general, when the volume of the storage element increases, the thermal stability and the writing current are known to increase. Conversely, when the volume of the storage element decreases, the thermal stability and the writing current are known to decrease.

It is desirable to provide a storage element capable of ensuring thermal stability as much as possible without an increase in a wiring current and a storage device including the storage element.

According to an embodiment of the present disclosure, there is provided a storage element having the following configuration.

That is, the storage element according to the embodiment of the present disclosure includes a storage layer which has magnetization perpendicular to a film surface and in which a direction of the magnetization is changed for information.

Also, the storage element includes a magnetization fixing layer that has magnetization perpendicular to the film surface and serving as a reference of the information stored in the storage layer.

Also, the storage element includes an insulation layer that is formed of a non-magnetic body disposed between the storage layer and the magnetization fixing layer.

Also, the information is stored by reversing the magnetization of the storage layer through spin torque magnetization reversal occurring with a current flowing in a lamination direction of a layer configuration of the storage layer, the insulation layer, and the magnetization fixing layer.

The size of the storage layer is necessarily less than a size in which a direction of the magnetization is simultaneously changed.

According to another embodiment of the present disclosure, there is provided a storage device including the storage element described above and two kinds of lines that intersect one another. The storage element is disposed between the two kinds of lines. A current flows in the storage element in the lamination direction via the two kinds of lines and the spin torque magnetization reversal thus occurs.

In the storage element according to the embodiment of the present disclosure, the magnetization fixing layer and the storage layer are formed with the insulation layer (tunnel barrier layer) interposed therebetween. Since information is recorded by reversing the magnetization of the storage layer through the spin torque magnetization reversal occurring with the current flowing in the lamination direction, the information can be recorded by causing the current to flow in the lamination direction. At this time, since the size of the storage layer is less than the size in which the direction of the magnetization is simultaneously changed, the low power consumption can be realized while ensuring the thermal stability as much as possible.

In the configuration of the storage device according to the embodiment of the present disclosure, the current flows in the storage element in the lamination direction via the two kinds of lines and spin transfer thus occurs. Therefore, the information can be recorded through the spin torque magnetization reversal by causing the current to flow in the lamination direction of the storage element via the two kinds of lines.

Since the thermal stability of the storage layer can be sufficiently maintained, the information recorded in the storage element can be stably held. Further, it is possible to miniaturize the storage device, improve reliability, and realize the low power consumption.

According to the embodiments of the present disclosure, the thermal stability can be efficiently improved for a writing current in an ST-MRAM having vertical magnetic anisotropy. Therefore, it is possible to realize the storage element ensuring the thermal stability as an information holding capability and thus having excellent characteristic balance such as power consumption.

Thus, an operation error can be prevented and an operation margin of the storage element can be sufficiently obtained.

Accordingly, it is possible to realize the memory operating stably and having high reliability.

Further, the writing current can be reduced, and thus the power consumption can be reduced when information is written on the storage element. Accordingly, the entire power consumption of the storage device can be reduced.

Additional features and advantages are described herein, and will be apparent from the following Detailed Description and the figures.

DETAILED DESCRIPTION

Figure 1:
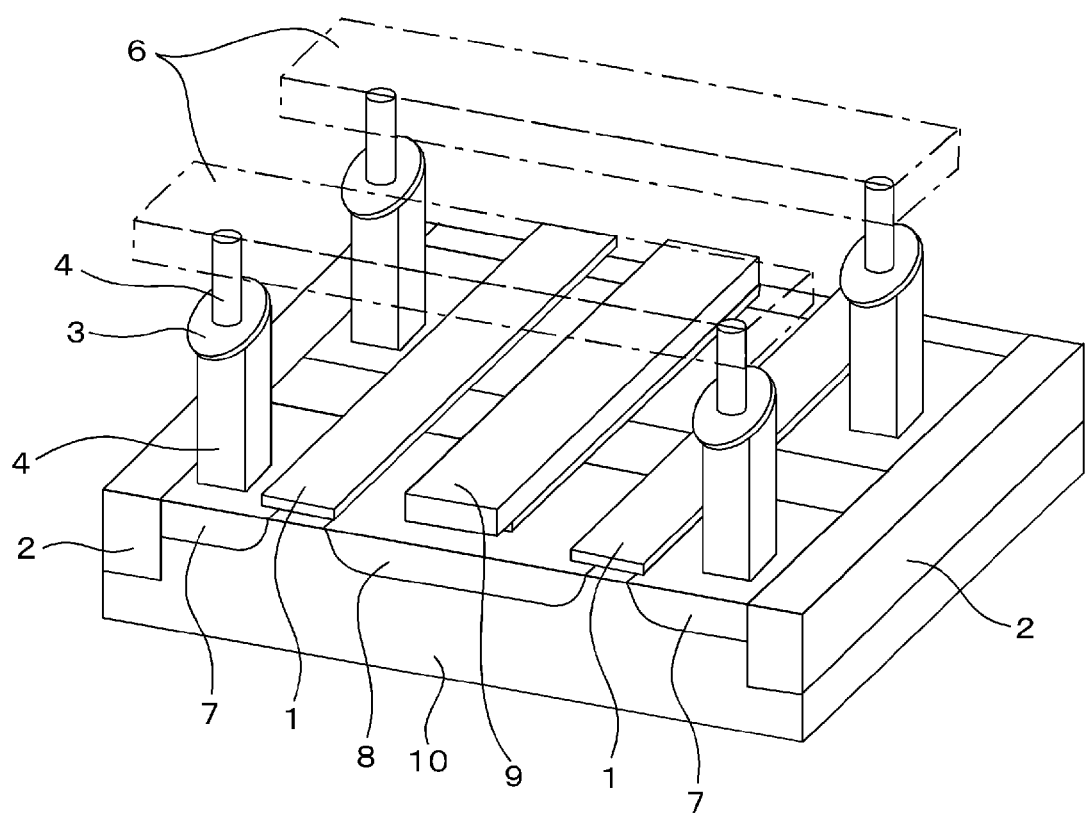
FIG. 1 is a schematic diagram (perspective view) illustrating a storage device (memory device) according to an embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, an embodiment of the present disclosure will be described in the following order.

1. Storage Element according to Embodiment
2. Configuration of Storage Device according to Embodiment
3. Specific Configuration according to Embodiment
4. Experiment according to Embodiment 1. Storage Element According to Embodiment First, a storage element according to an embodiment of the present disclosure will be described.

In the embodiment of the present disclosure, information is recorded by reversing the direction of magnetization of a storage layer of the storage element through the above-described spin torque magnetization reversal.

The storage layer is configured by a magnetic body including a ferromagnetic layer and information is held according to a magnetization state (the direction of magnetization).

Figure 3:
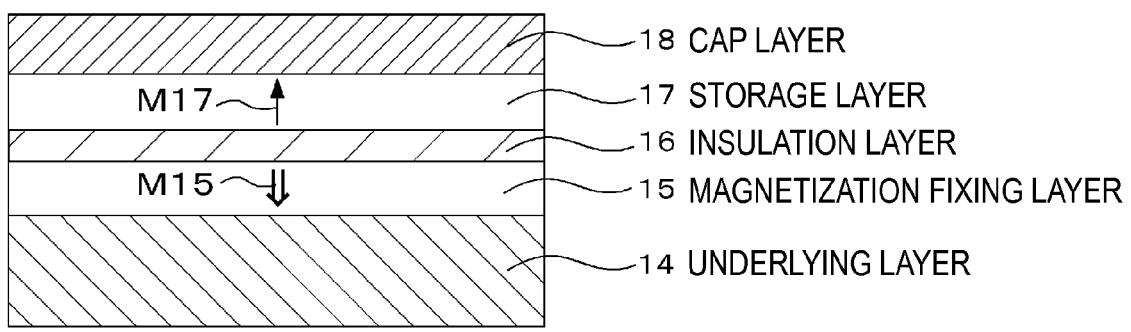
FIG. 3 is a sectional view illustrating a storage element according to the embodiment.

For example, a storage element 3 has a layer configuration shown in FIG. 3. The storage element 3 includes at least a storage layer 17 and a magnetization fixing layer 15 as two ferromagnetic layers and includes an insulation layer 16 as an intermediate layer between the two ferromagnetic layers.

The storage element 3 further includes a cap layer 18 on the storage layer 17 and includes an underlying layer 14 below the magnetization fixing layer 15.

The storage layer 17 has magnetization perpendicular to a film surface. The direction of the magnetization is changed so as to correspond to the information.

The magnetization fixing layer 15 has magnetization perpendicular to a film surface serving as a reference of the information stored in the storage layer 17.

The insulation layer 16 is a non-magnetic body and is formed between the storage layer 17 and the magnetization fixing layer 15.

When spin-polarized electrons are injected in a lamination direction of the layer configuration of the storage layer 17, the insulation layer 16, and the magnetization fixing layer 15, the direction of the magnetization of the storage layer 17 is changed and information is thus recorded on the storage layer 17.

Hereinafter, spin torque magnetization reversal will be described simply.

Electrons have two kinds of spin angular momenta. Here, the electrons are defined as upward electrons and downward electrons. In the non-magnetic body, the upward and downward electrons are the same in number. In the ferromagnetic body, the upward and downward electrons are different in number. In the magnetization fixing layer 15 and the storage layer 17, which are two ferromagnetic layers of the storage element 3, a case in which electrons are moved from the magnetization fixing layer 15 to the storage layer 17 when the directions of magnetic moments are opposite to one another will be considered.

The magnetization fixing layer 15 is a fixing magnetic layer in which the direction of a magnetic moment is fixed to ensure high coercivity.

In the electrons passing through the magnetization fixing layer 15, spin polarization occurs, that is, there is a difference in number between the upward and downward electrons. When the non-magnetic insulation layer 16 has a sufficient thickness, the electrons reach the other magnetic body, that is, the storage layer 17, before the spin polarization of the electrons passing through the magnetization fixing layer 15 is alleviated and the electrons enter a non-polarized state (in which the upward and downward electrons are the same in umber) in a normal non-magnetic body.

In the storage layer 17, since the sign of the degree of spin polarization is opposite, some of the electrons are reversed, that is, the direction of the spin angular momentum is changed to lower the energy of a system. At this time, since the entire angular momenta of the system have to be conserved, the reaction equivalent to the sum of the change in the angular momenta caused by the electrons of which the direction is changed is applied to the magnetic moment of the storage layer 17.

When a current, that is, the number of electrons passing in a unit time, is small, the total number of electrons of which the direction is changed is also small. Therefore, a change in the angular momentum occurring in the magnetic moment of the storage layer 17 is also small. However, when the current increases, the angular momentum can be considerably changed in a unit time.

A time change of an angular momentum is a torque. When a torque is greater than a given threshold, the magnetic moment of the storage layer 17 starts a precession movement. The magnetic moment is stabilized after the magnetic moment rotates by 180 degrees by uniaxial anisotropy. That is, the magnetic moment is reversed from an opposite direction to the same direction.

When a current reversely flows in a direction in which electrons are sent from the storage layer 17 to the magnetization fixing layer 15 in a state of the same direction of the magnetization, a torque is applied in a case in which the electrons are reflected from the magnetization fixing layer 15 and the spin-reversed electrons enter the storage layer 17. Then, the magnetic moment can be reversed in the opposite direction. At this time, the amount of current necessary to cause the reversal is greater compared to a case in which the magnetic moment is reversed from the opposite direction to the same direction.

It is difficult to intuitively understand the reversal of the magnetic moment from the same direction to the opposite direction, but the storage layer 17 may be considered to be reversed to conserve the entire angular momenta of a system without the reversal of the magnetic moment since the magnetization fixing layer 15 is fixed. Thus, "0/1" is recorded by causing a current corresponding to each polarity and equal to or greater than a given threshold to flow in the direction from the magnetization fixing layer 15 to the storage layer 17 or in the opposite direction.

Information is read using a magnetic resistive effect, as in an MRAM according to the related art. That is, a current flows in a direction perpendicular to a film surface, as in the recording case described above. The change phenomenon of electric resistance of an element is used depending on whether the direction of the magnetic moment of the storage layer 17 is the same as or opposite to the direction of the magnetic moment of the magnetization fixing layer 15.

A metal or insulation material may be used as the material of the insulation layer 16 formed between the magnetization fixing layer 15 and the storage layer 17. When an insulation material is used as the material of the insulation layer 16, a high reading signal (resistance change ratio) can be obtained and information can be recorded with a lower current. In this case, an element is referred to as a magnetic tunnel junction (MTJ) element.

When the direction of the magnetization of a magnetic layer is reversed through spin torque magnetization reversal, a threshold value Ic of a necessary current is different depending on whether a magnetization-easy axis of the magnetic layer is in an in-plane direction or a vertical direction.

The storage element according to the embodiment is a vertical magnetization type storage element. A reversal current used to reverse the direction of the magnetization of the magnetic layer is assumed to be Ic_para in an in-plane magnetization type storage element according to the related art.

When the magnetization is reversed from the same direction to the opposite direction (where the same direction and the opposite direction are the directions of the magnetization of the storage layer considered using the direction of the magnetization of the magnetization fixing layer as a reference), "Ic_para=(A·α·Ms·V/g(0)/P)(Hk+2πMs)" is satisfied.

When the magnetization is reversed from the opposite direction to the same direction), "Ic_para=−(A·α·Ms·V/g(π)/P)(Hk+2πMs)" is satisfied (which is referred to as Equation (1)).

On the other hand, a reversal current of the vertical magnetization type storage element is assumed to be Ic_perp. When the magnetization is reversed from the same direction to the opposite direction, "Ic_perp=(A·α·Ms·V/g(0)/P)(Hk−4πMs)" is satisfied.

When the magnetization is reversed from the opposite direction to the same direction, "Ic_perp=−(A·α·Ms·V/g(π)/P)(Hk+4πMs)" is satisfied (which is referred to as Equation (2)).

In the equations, A denotes a constant, α denotes a damping constant, Ms denotes saturated magnetization, V denotes an element volume, P denotes spin polarizability, g(0) and g(π) denote coefficients corresponding to efficiency of a spin torque applied to a magnetic layer in the same direction and the opposite direction, respectively, and Hk denotes magnetic anisotropy (see Nature Materials., 5, 210 (2006)).

When the vertical magnetization type storage element (Hk−4πMs) is compared to the in-plane magnetization type storage element (Hk+2πMs) in the above-mentioned equations, the vertical magnetization type storage element can be understood to be suitable by a low recording current.

In this embodiment, the storage element 3 is configured to include a magnetic layer (the storage layer 17) in which information can be held according to a magnetization state and the magnetization fixing layer 15 in which the direction of the magnetization is fixed.

To function as a storage device, written information has to be held. The value of an index Δ ($=KV/k_B T$) of thermal stability is used as the index of the capability of holding information. Here, Δ is expressed by Equation (3) below.

$$\Delta = K \cdot V/k_B \cdot T = Ms \cdot V \cdot Hk \cdot (1/2 k_B \cdot T) \quad \text{Equation (3)}$$

In this equation, Hk is an effective anisotropy field, $k_B$ is the Boltzmann's constant, T is temperature, Ms is a saturated magnetization amount, V is the volume of the storage layer 17, and K is anisotropic energy.

The effective anisotropy field Hk receives the influence of magnetic anisotropy such as shape magnetic anisotropy, induced magnetic anisotropy, or crystal magnetic anisotropy. When a single-section simultaneous rotation model is supposed, the effective anisotropy is equal to coercivity.

Further, when the threshold value Ic is expressed in relation to Δ above, Equation (4) below is established.

[Expression 1]

$$I_C = \left(\frac{4 e k_B T}{\hbar}\right)\left(\frac{\alpha \Delta}{\eta}\right) \quad \text{Equation (4)}$$

In this equation, e is an element charge, $k_B$ is the Boltzmann's constant, T is temperature, Ms is a saturated magnetization amount, α is a Gilbert damping constant, H bar is the Flank's constant, and η is spin injection efficiency.

When the values of Hk, Ms, α, and η are determined according to Equation (3) and Equation (4), Δ and Ic are proportional to the volume V of the recording layer. That is, when the volume V of the recording layer increases, Δ and Ic increase. Conversely, when the volume V of the storage layer decreases, Δ and Ic decrease. This principle can be understood from the above-mentioned theoretical equation.

However, in the actual storage layer, it has been found that an increasing rate of Δ and Ic with respect to the volume of the storage layer is changed when the volume of the storage layer is equal to or greater than a given size.

According to this relation, when the volume of the storage layer is equal to or greater than the given size, only Ic increases without an increase in Δ in spite of the fact that the volume of the storage layer increases over the given size. This means that a ratio between Δ and Ic decreases when the volume of the storage layer is greater than a given size of the storage layer. Therefore, it is difficult to establish an effective existence condition of the ST-MRAM as a non-volatile memory, that is, compatibility between low-current information recording and high thermal stability of recorded information.

Accordingly, it is important to balance the value of the index Δ of the thermal stability and the threshold value Ic.

In many cases, the value of the index Δ of the thermal stability and the threshold value Ic have a tradeoff relation. Therefore, the compatibility is a task of maintaining the memory characteristics.

With regard to the threshold value of the current used to change the magnetization state of the storage layer 17, in fact, the thickness of the storage layer 17 is, for example, 2 nm. In a substantially elliptical TMR element with a planar pattern of 100 nm×150 nm, the threshold value +Ic of a positive side is equal to +0.5 mA and the threshold value −Ic of a negative side is equal to −0.3 mA. At this time, a current density is about $3.5 \times 10^5$ A/cm$^2$. These values are identical to those in Equation (1).

However, in a normal MRAM in which magnetization is reversed through a current magnetic field, a writing current of a few mA or more is necessary.

Accordingly, in the ST-MRAM, the threshold value of the writing current is sufficiently small, as described above. Therefore, the threshold value can be understood to be effective for reducing the power consumption of an integrated circuit.

Further, since a wiring line necessary in the normal MRAM to generate a current magnetic field is not necessary, the advantage of the degree of integration can be obtained compared to the normal MRAM.

When the spin torque magnetization reversal is performed, information is written (recorded) by causing a current to flow directly to the storage element 3. Therefore, the storage device includes the storage element 3 and a selection transistor connected to each other to select the storage element 3 that writes information.

In this case, the current flowing in the storage element 3 is restricted by the magnitude of the current (the saturated current of the selection transistor) that can flow in the selection transistor.

The vertical magnetization type storage element is preferably used to reduce the recording current, as described above. Further, since a vertical magnetization film can have magnetic anisotropy higher than an in-plane magnetization film, the large index Δ of the above-described thermal stability is preferably maintained.

Examples of a magnetic material with vertical anisotropy include alloys of rare-earths and transition metals (TbCoFe and the like), metal multilayer films (Cd/Pd multilayer films and the like), ordered alloys (FePt and the like), and materials using interfacial anisotropy (Co/MgO and the like) between an oxide and a magnetic metal. The alloys of rare-earths and transition metals are not desirable as the material of the ST-MRAM. This is because vertical magnetic anisotropy is lost when the alloys are diffused and crystallized by heating. The metal multilayer films are known to be diffused by heating and thus deteriorate in the vertical magnetic anisotropy and the vertical magnetic anisotropy is expressed when face-centered cubic (111) orientation is realized. Therefore, it is difficult to realize (001) orientation necessary in a high polarizability layer such as MgO or Fe, CoFe, CoFeB, or the like adjacent to MgO. Since L10 ordered alloys are stable at high temperatures and the vertical magnetic anisotropy is expressed at the (001) orientation time, the above-mentioned problems do not occur. However, since it is necessary to arrange atoms orderly by performing heating at the sufficiently high temperature of 500° C. or more during manufacturing or by performing heating at the sufficiently high temperature of 500° C. or more after the manufacturing, there is a probability that undesirable diffusion may occur in another portion of a laminated layer such as a tunnel barrier or interface roughness may increase.

However, the above-mentioned problems rarely occur for a material using interface magnetic anisotropy, that is, a material in which a Co-based material or a Fe-based material is laminated on MgO serving as a tunnel barrier. Therefore, the material is expected as the material of the storage layer of the ST-MRAM.

In this embodiment, a material having Co—Fe—B as a base is used as the material of the storage layer 17. Several elements of Ti, V, Nb, Zr, Ta, Hf, Y, and the like may be added as non-magnetic metals to Co—Fe—B.

Further, in consideration of the saturated current value of the selection transistor, an MTJ element is configured using a tunnel insulation layer that includes an insulator as the non-magnetic insulation layer 16 between the storage layer 17 and the magnetization fixing layer 15.

When the MTJ element is configured using the tunnel insulation layer, a magnetoresistance ratio (MR ratio) can be increased compared to a case in which a grant magnetoresistive effect (GMR) element is configured using a non-magnetic conductive layer. Therefore, the intensity of a reading signal can be increased.

In particular, the magnetoresistance ratio (MR ratio) can be increased using magnesium oxide (MgO) as the material of the insulation layer 16 serving as a tunnel insulation layer.

In general, a spin transfer efficiency depends on the MR ratio. The larger the MR ratio is, the more the spin transfer efficiency is improved. Therefore, a magnetization reversal current density can be reduced.

Accordingly, by using the magnesium oxide as the material of the tunnel insulation layer and the storage layer 17, it is possible to reduce the threshold value of the writing current through the spin torque magnetization reversal. Therefore, information can be written (recorded) with a lower current. Further, the intensity of the reading signal can be increased.

Thus, since the MR ratio (TMR ratio) can be ensured and the threshold value of the writing current can be reduced through the spin torque magnetization reversal, information can be written (recorded) with a lower current. Further, the intensity of the reading signal can be increased.

When the tunnel insulation layer is formed of a magnesium oxide (MgO) film, the MgO film is crystallized. Therefore, crystal orientation is more preferably maintained in the 001 direction.

In this embodiment, the insulation layer 16 (the tunnel insulation layer) formed between the storage layer 17 and the magnetization fixing layer 15 is formed of not only magnesium oxide but also various insulators such as aluminum oxide, aluminum nitride, $SiO_2$, $Bi_2O_3$, $MgF_2$, $CaF$, $SrTiO_2$, $AlLaO_3$, and Al—N—O, a dielectric material, a semiconductor, or the like.

It is necessary to control the area resistive value of the insulation layer 16 serving as the tunnel insulation layer such that the area resistive value is equal to or less than about tens of $\Omega\mu m^2$ in terms of obtainment of the current density necessary for reversing the direction of the magnetization of the storage layer 17 through the spin torque magnetization reversal.

In the tunnel insulation layer formed of a MgO film, the thickness of the MgO film should be set 1.5 nm or less, so that the area resistive value is in the above-described range.

In the ST-MRAM, 0 and 1 of information are determined by relative angles of magnetization M17 of the storage layer 17 and magnetization M15 of the magnetization fixing layer 15.

The underlying layer 14 is formed below the magnetization fixing layer 15 and the cap layer 18 is formed on the storage layer 17.

In this embodiment, the insulation layer 16 is formed as a magnesium oxide layer to increase the magnetoresistance ratio (MR ratio).

By increasing the MR ratio, it is possible to improve the spin injection effect and reduce the current density necessary for reversing the direction of the magnetization M17 of the storage layer 17.

Figure 2:
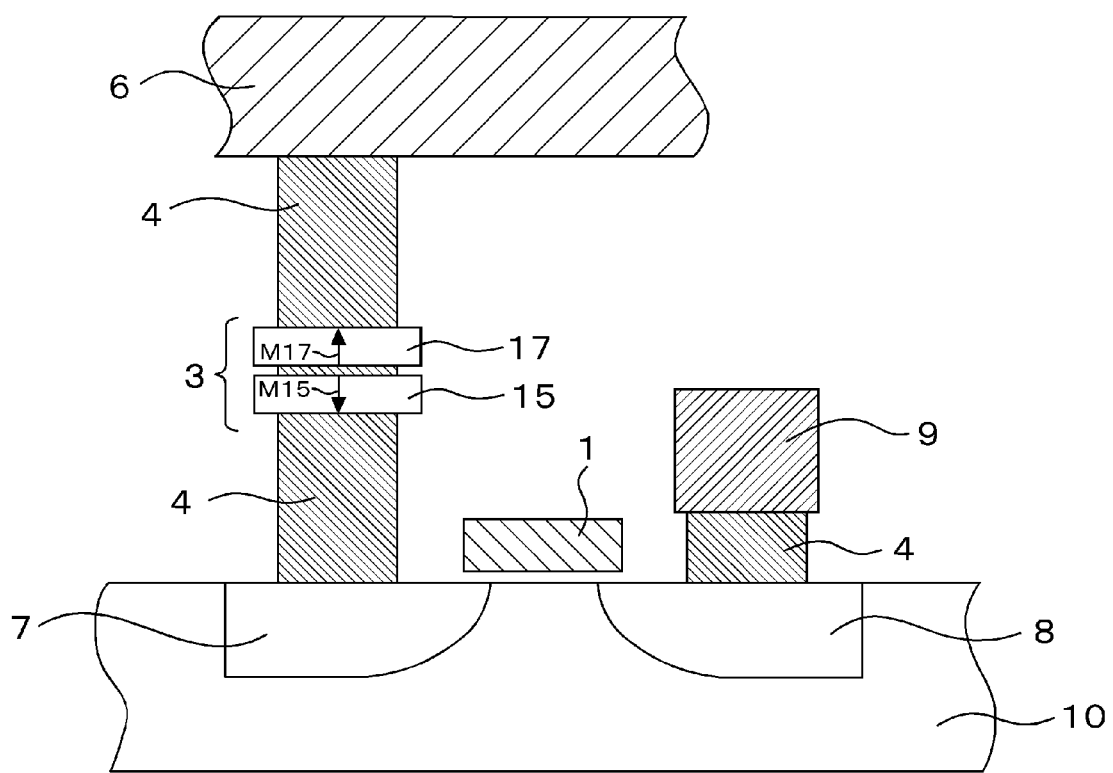
FIG. 2 is a sectional view illustrating the storage device according to the embodiment.

The storage device shown in FIG. 1 and including the storage element 3 shown in FIG. 2 has the advantage of applying a general semiconductor MOS forming process when a storage device is manufactured.

Accordingly, the storage device according to this embodiment is applicable to a general-purpose memory.

Since the size of the storage layer 17 can be less than a size in which the direction of the magnetization is simultaneously changed, the power consumption can be suppressed to be as small as possible. Thus, it is possible to realize the ST-MRAM using the thermal stability of the storage element 3 as much as possible. The specific size of the storage layer 17 of the storage element 3 is preferably equal to or less than a diameter of 45 nm.

Thus, it is possible to realize the storage element 3 that has excellent characteristic balance while ensuring the thermal stability as the information holding capability with low power consumption.

Since the operation margin of the storage element 3 can be sufficiently obtained by removing an operation error, the storage element 3 can stably operate. Accordingly, it is possible to realize a storage device operating stably and having high reliability.

Since the writing current is reduced, the power consumption can be reduced when information is written on the storage element 3. Accordingly, the entire power consumption of the storage device can be reduced.

In this embodiment, a metal such as Ta is used in the cap layer 18 formed to be adjacent to the storage layer 17.

An element other than Co and Fe may be added to the storage layer 17 according to the embodiment of the present disclosure.

When a different kind of element is added, it is possible to obtain an effect of an improvement in heat resistance by diffusion prevention, an increase in the magnetoresistive effect, an increase in a dielectric strength voltage obtained with flattening, or the like. Examples of the added element include B, C, N, O, F, Mg, Si, P, Ti, V, Cr, Mn, Ni, Cu, Ge, Nb, Mo, Ru, Rh, Pd, Ag, Ta, W, Ir, Pt, Au, Zr, Hf, Re, Os, or an alloy thereof.

In the configuration of the storage layer 17 according to the embodiment of the present disclosure, another ferromagnetic layer may be directly laminated. Further, a ferromagnetic layer and a soft magnetic layer may be laminated or a plurality of ferromagnetic layers may be laminated with a soft magnetic layer or a non-magnetic layer interposed therebetween.

Even when these magnetic layers are laminated, the advantages of the embodiment of the present disclosure can be obtained.

In particular, when a plurality of ferromagnetic layers are laminated with a non-magnetic layer interposed therebetween, the strength of a mutual interaction between the ferromagnetic layers can be adjusted. Therefore, it is possible to obtain the advantage of preventing the magnetization reversal current from increasing in spite of the fact that the dimension of the storage element 3 is equal to or less than a submicron. In this case, Ru, Os, Re, Ir, Au, Ag, Cu, Al, Bi, Si, B, C, Cr, Ta, Pd, Pt, Zr, Hf, W, Mo, Nb, or an alloy thereof can be used as the material of the non-magnetic layer.

In the magnetization fixing layer 15, the direction of the magnetization is fixed only from the ferromagnetic layer or using antiferromagnetic coupling of an antiferromagnetic layer and a ferromagnetic layer.

The magnetization fixing layer 15 may include a single-layered ferromagnetic layer or may have a lamination ferri-pin structure in which a plurality of ferromagnetic layers are laminated with a non-magnetic layer interposed therebetween.

As the material of the ferromagnetic layer of the magnetization fixing layer 15 having the lamination ferri-pin structure, Co, CoFe, CoFeB, or the like can be used. As the material of the non-magnetic layer, Ru, Re, Ir, Os, or the like can be used.

As the material of the antiferromagnetic layer, a FeMn alloy, a PtMn alloy, a PtCrMn alloy, a NiMn alloy, an IrMn alloy, or a magnetic body such as NiO, $Fe_2O_3$ can be used.

Further, a non-magnetic element such as Ag, Cu, Au, Al, Si, Bi, Ta, B, C, O, N, Pd, Pt, Zr, Hf, Ir, W, Mo, Nb, or the like may be added to the magnetic body to adjust the magnetic characteristics or adjust various matter properties such as a crystal structure, a crystalline property, and substance stability.

The remaining configuration other than the configuration of the storage layer 17 and the magnetization fixing layer 15 of the storage element 3 is the same as the configuration of the storage element 3 that records information through spin torque magnetization reversal according to the related art.

In the configuration of the storage element 3, the storage layer 17 may, of course, be disposed below the magnetization fixing layer 15. In this case, the conductive oxide underlying layer undertakes the role of the conductive oxide cap layer.

As described above, the storage element 3 has the lamination configuration in which the cap layer 18, the storage layer 17, the insulation layer 16, the magnetization fixing layer 15, and the underlying layer 14 are laminated from the upper layer side. However, the storage element 3 of this embodiment may have a configuration in which the storage layer 17 is laminated below the magnetization fixing layer 15.

Specifically, the storage element 3 may have a configuration in which the cap layer 18, the magnetization fixing layer 15, the insulation layer 16, the storage layer 17, and the underlying layer 14 are formed sequentially from the upper layer side.

2. Configuration of Storage Device According to Embodiment

Next, the configuration of the storage device according to the embodiment of the present disclosure will be described.

FIGS. 1 and 2 are schematic diagrams illustrating the storage device according to the embodiment. FIG. 1 is a perspective view and FIG. 2 is a sectional view.

As shown in FIG. 1, the storage device according to the embodiment includes the storage element 3 configured by an ST-RAM capable of holding information by a magnetization state near an intersection of two kinds of addresses lines (for example, a word line and a bit line) perpendicular to one another.

That is, a drain region 8, a source region 7, and a gate electrode 1 that form a selection transistor configured to select each storage device are formed in a portion isolated by element isolation layers 2 of a semiconductor base substrate 10 such as a silicon substrate. In particular, the gate electrode 1 also serves as one address line (word line) extending in the front and rear directions in the drawing.

The drain region 8 is formed commonly in the selection transistors on the right and left of FIG. 1. A wiring line 9 is connected to the drain region 8.

The storage element 3 that is disposed above the source region 7 and includes the storage layer in which the direction of the magnetization is reversed through the spin torque magnetization reversal is disposed between the source region 7 and the bit line 6 extending in the right and left directions of FIG. 1. The storage element 3 is configured by, for example, an MTJ element.

As shown in FIG. 2, the storage element 3 includes two magnetic layers 15 and 17. Of the two-layered magnetic layers 15 and 17, the magnetization fixing layer 15 is configured as a layer in which the direction of magnetization M15 is fixed and the storage layer 17 is configured as a free magnetization layer in which the direction of magnetization M17 is changed.

The storage element 3 is connected to the bit line 6 and the source region 7 with upper and lower contact layers 4 interposed therebetween, respectively.

Thus, when a current flows in the storage element 3 in the vertical direction via two kinds of address lines 1 and 6, the direction of the magnetization M17 of the storage layer 17 can be reversed through the spin torque magnetization reversal.

In such a storage device, it is necessary to write information using a current equal to or less than a saturated current of the selection transistor. Therefore, the saturated current of the selection transistor is known to decrease with miniaturization of the storage device. Accordingly, to miniaturize the storage device, it is necessary to improve the spin transfer efficiency and reduce the current flowing in the storage device 3.

Further, to increase a reading signal, it is necessary to ensure a large magnetoresistance ratio. Therefore, it is effective to use the above-described MTJ structure, that is, the configuration of the storage element 3 in which the insulation layer is formed as the tunnel insulation layer (tunnel barrier layer) between the two layers of the magnetic layers 15 and 17.

When the tunnel insulation layer is used as the insulation layer, the amount of current flowing in the storage element 3 is restricted to prevent the insulation destruction of the tunnel insulation layer. That is, a current necessary for the spin torque magnetization reversal should be suppressed to ensure the reliability of overwriting of the storage element 3.

The current necessary for the spin torque magnetization reversal is also referred to as a reversal current or a recording current.

Since the storage device is a non-volatile memory, the storage device should stably store information written using a current. That is, it is necessary to ensure stability (thermal stability) against thermal fluctuation of the magnetization of the storage layer.

When the thermal stability of the storage layer is not ensured, the reversed direction of the magnetization may be reversed again due to heat (the temperature of an operation environment) in some cases, and therefore a writing error may be caused.

The storage element 3 of the storage device according to the embodiment of the present disclosure has the advantage of the scaling compared to an MRAM according to the related art, that is, the advantage of reducing the volume of the storage element. However, when the volume of the storage element is reduced, the thermal stability has a tendency to deteriorate under the same conditions of the other characteristics.

When the ST-MRAM has a large capacity, the volume of the storage element 3 is further reduced. Therefore, to ensure the thermal stability is an important task.

Accordingly, the thermal stability is a very important characteristic of the storage element 3 in the ST-MRAM. Even when the volume of the storage element is reduced, the storage element should be designed to ensure the thermal stability.

In the embodiment of the present disclosure, the size of the storage layer 17 of the storage element 3 is less than a size in which the direction of the magnetization is simultaneously changed. The specific size of the storage layer 17 of the storage element 3 is preferably equal to or less than a diameter of 45 nm. Thus, the power consumption is suppressed to be as small as possible. Thus, it is possible to realize the ST-MRAM using the thermal stability of the storage element 3 as much as possible.

The writing current for the storage element 3 is reduced. Since the power consumption is reduced, the entire power consumption of the storage device can be reduced.

The storage device shown in FIG. 1 and including the storage element 3 shown in FIG. 2 has the advantage of applying a general semiconductor MOS forming process when the storage device is manufactured.

Accordingly, the storage device according to this embodiment is applicable to a general-purpose memory.

3. Specific Configuration According to Embodiment

Next, a specific configuration of the embodiment of the present disclosure will be described.

In the configuration of the storage device, as described above with reference to FIG. 1, the storage element 3 capable of holding information according to a magnetization state is disposed near an intersection of two kinds of address lines 1 and 6 (for example, a word line and a bit line) perpendicular to each other.

Further, when a current flows in the storage element 3 in the vertical direction via two kinds of address lines 1 and 6, the direction of the magnetization of the storage layer 17 can be reversed through the spin torque magnetization reversal.

FIG. 3 shows a detailed configuration of the storage element 3.

As shown in FIG. 3, the storage element 3 includes the magnetization fixing layer 15 below the storage layer 17 in which the direction of the magnetization M17 is reversed through the spin torque magnetization reversal.

In the ST-MRAM, 0 and 1 of information are determined by relative angles of the magnetization M17 of the storage layer 17 and the magnetization M15 of the magnetization fixing layer 15.

The insulation layer 16 configured as a tunnel barrier layer (tunnel insulation layer) is disposed between the storage layer 17 and the magnetization fixing layer 15, so that the MTJ element is configured by the storage layer 17 and the magnetization fixing layer 15.

The underlying layer 14 is formed below the magnetization fixing layer 15.

The cap layer 18 is formed above the storage layer 17 (that is, the side adjacent to the storage layer 17 and opposite to the insulation layer 16).

In this embodiment, the storage layer 17 is a vertical magnetization layer formed of Co—Fe—B.

The cap layer 18 is formed of a conductive oxide.

The size of the storage layer 17 of the storage element 3 is less than a size in which the direction of the magnetization is simultaneously changed. The specific size of the storage layer 17 is preferably equal to or less than a diameter of 45 nm.

In this embodiment, when the insulation layer 16 is formed of a magnesium oxide layer, the magnetoresistance ratio (MR ratio) can be increased.

By increasing the MR ratio, it is possible to improve the spin injection effect and reduce the current density necessary to reverse the direction of the magnetization M17 of the storage layer 17.

The storage element 3 according to this embodiment can be manufactured by continuously forming the underlying layer 14 to the cap layer 18 in a vacuum apparatus, and then forming the pattern of the storage element 3 by etching or the like.

According to the above-described embodiment, since the storage layer 17 of the storage element 3 is a vertical magnetization layer, it is possible to reduce the amount of writing current necessary to reverse the direction of the magnetization M17 of the storage layer 17.

Thus, since the thermal stability can be sufficiently ensured as the information holding capability, the storage element 3 having the excellent characteristic balance can be configured.

Since an operation error can be presented and the operation margin of the storage element 3 can be sufficiently obtained, the storage element 3 can stably operate.

That is, the storage device operating stably and having high reliability can be realized.

Further, since the wiring current is reduced, it is possible to reduce the power consumption when information is written on the storage element 3.

As a result, the storage device including the storage element 3 according to this embodiment can reduce the power consumption.

Thus, since a storage device having an excellent information holding characteristic and operating stably and reliably can be realized, the power consumption can be reduced in the storage device including the storage element 3.

Further, the storage device shown in FIG. 1 and including the storage element 3 shown in FIG. 3 has the advantage of applying a general semiconductor MOS forming process when the storage element is manufactured.

Accordingly, the storage device according to this embodiment is applicable to a general-purpose memory.

4. Experiment According to Embodiment

Here, samples of the storage element 3 were manufactured while changing the size of the storage layer 17 in the configuration of the storage element 3 described above with reference to FIGS. 1 to 3, and the characteristics of the storage element 3 were inspected.

In the actual storage device, as shown in FIG. 1, not only the storage element 3 but also a switching semiconductor circuit and the like are present. However, an examination was made on a wafer on which only the storage element 3 was formed to examine the magnetization reversal characteristic of the storage layer 17 adjacent to the cap layer 18.

Figure 4:
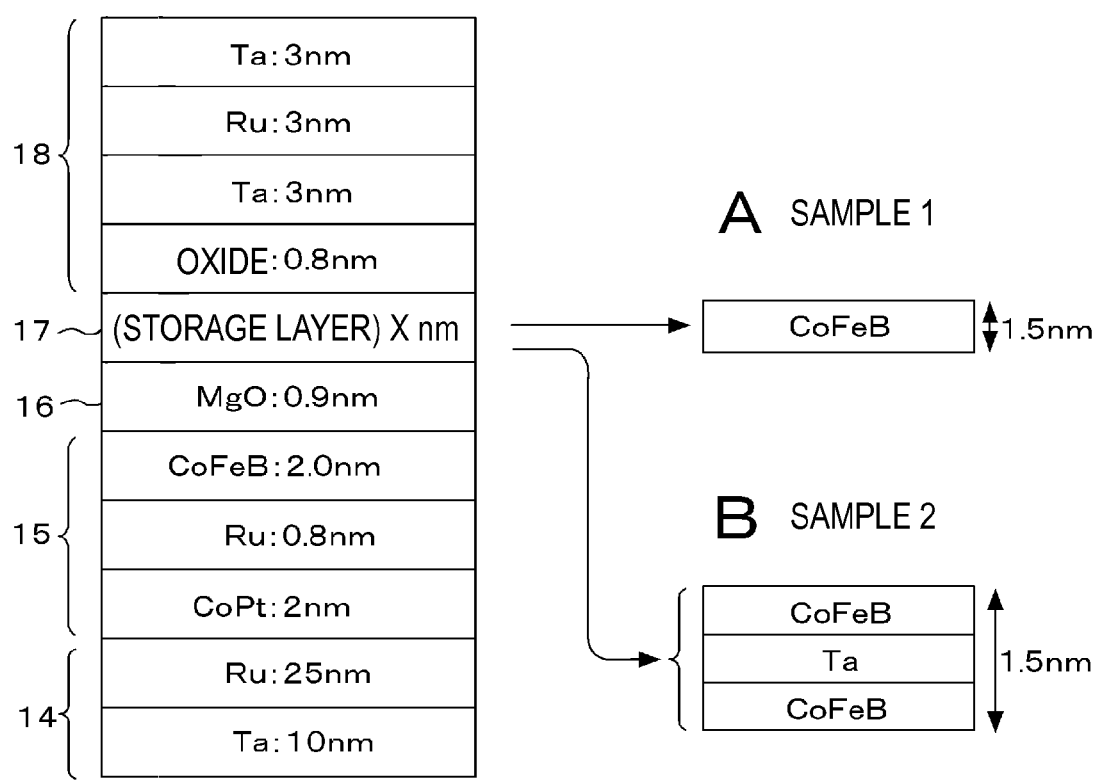
FIG. 4 is a diagram illustrating a cross-sectional configuration of samples of the storage element used in an experiment.

A thermal oxide film with a thickness of 300 nm was formed on a silicon substrate with a thickness of 0.725 mm, and then the storage element 3 having the configuration shown in FIGS. 3 and 4 was formed on the thermal oxide film.

Specifically, the material and the thickness of each layer of the storage element 3 shown in FIG. 3 were as follows.

As shown in FIG. 4, the underlying layer 14 was formed as a lamination layer of a Ta film with a thickness of 10 nm and a Ru film with a thickness of 25 nm, the magnetization fixing layer 15 was formed as a layer including a CoPt film with a thickness of 2.0 nm, a Ru film with a thickness of 0.8 nm, and a Co—Fe—B film with a thickness of 2.0 nm, the insulation layer 16 was formed as a magnesium oxide layer with a thickness of 0.9 nm, the storage layer 17 was formed as a CoFeB layer (A of FIG. 4) or a CoFeB/Ta/CoFeB layer (B of FIG. 4) with a thickness of 1.5 nm, and the cap layer 18 was formed as a layer including an oxide film with a thickness of 0.8 nm, a Ta film with a thickness of 3 nm, a Ru film with a thickness of 3 nm, and a Ta film with a thickness of 3 nm.

Here, the storage element 3 shown in A of FIG. 4 is indicated by Sample 1 and the storage element 3 shown in B of FIG. 4 is indicated by Sample 2.

In the film configuration, the composition of CoFeB of a ferromagnetic layer of the storage layer 17 was Co at 16%—Fe at 64%—B at 20%.

The insulation layer 16 configured by the magnesium oxide (MgO) film and the oxide film of the cap layer 18 were formed by an RF magnetron sputtering method and the other films were formed by a DC magnetron sputtering method.

Each sample was subjected to heat processing in a heat processing furnace in a magnetic field, after each layer was formed. Thereafter, the cylindrical storage layers 17 with diameters of 30 nm, 40 nm, 65 nm, 75 nm, 90 nm, and 120 nm were manufactured by general electron beam lithography and a general ion milling process.

The characteristics of each sample of the manufactured storage element 3 were evaluated as follows.

Before the measurement, a magnetic field was designed to be applied to the storage element 3 to control the values of the reversal current such that the values of the reversal current in positive and negative directions were symmetric.

The voltage to be applied to the storage element 3 was set up to 1 V within a range in which the insulation layer 16 was not destructed.

Measurement of Saturated Magnetization Amount and Magnetic Anisotropy

The saturated magnetization Ms was measured through VSM measurement using a vibrating sample magnetometer. Further, an anisotropy magnetic field Hk was measured by applying a magnetic field in a plane-vertical direction and an in-plane direction and sweeping the magnetic field (measurement of a reversal current value and thermal stability).

The reversal current value was measured to evaluate the writing characteristic of the storage element 3 according to this embodiment.

The resistive value of the storage element 3 was then measured by causing a current with a pulse width in the range of 10 μs to 100 ms to flow in the storage element 3.

Further, the value of the current for which the direction of the magnetization M17 of the storage layer 17 of the storage element 3 was reversed was calculated by changing the amount of current flowing in the storage element 3. A value obtained by extrapolating the pulse width dependency of the value of the current at a pulse width of 1 ns was set as the value of the reversal current.

The inclination of the pulse width dependency of the value of the reversal current corresponds to the index $\Delta$ of the above-described thermal stability of the storage element 3. As the value of the reversal current is changed less by the pulse width (the inclination is small), the thermal stability means the strong degree against heat disturbance.

In consideration of a variation in the storage element 3, twenty storage elements 3 with the same configuration were manufactured to carry out the above-described measurements, and the average values of the values of the reversal current and the indexes $\Delta$ of the thermal stability were calculated.

A reversal current density Jc0 was calculated from the average value of the values of the reversal current obtained through the measurement and the area of the plane pattern of the storage element 3.

Figure 5A:
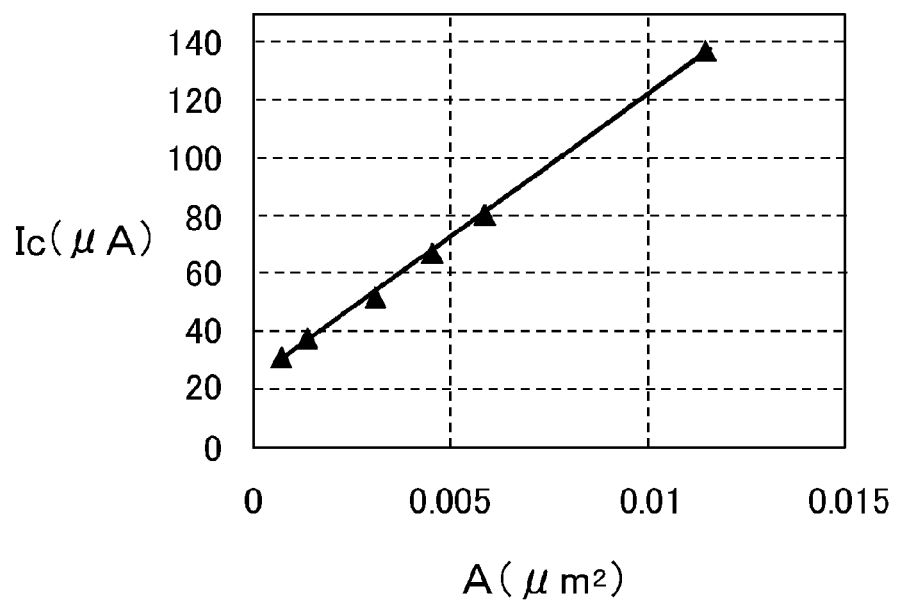
FIGS. 5A and 5B are diagrams illustrating dependencies of the size of a storage layer with respect to Ic and Δ obtained from an experiment of Sample 1.
Figure 5B:
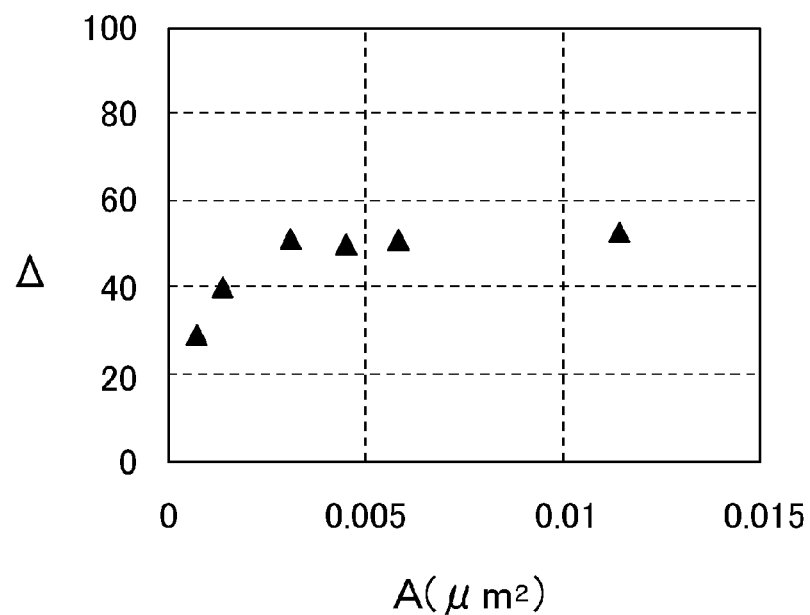

Here, FIGS. 5A and 5B show the size dependency of the storage layer 17 of the storage element 3 with respect to Ic (FIG. 5A) and $\Delta$ (FIG. 5B) obtained for Sample 1 from the experiment. In FIG. 5A, it can be confirmed that Ic increases as the size of the storage layer 17 increases, as anticipated from the equation of Ic_perp. Conversely, as shown in FIG. 5B, $\Delta$ does not coincide with the relation shown in Equation 3. Further, $\Delta$ does not monotonically increase, even when the size of the storage element increases.

Figure 6:
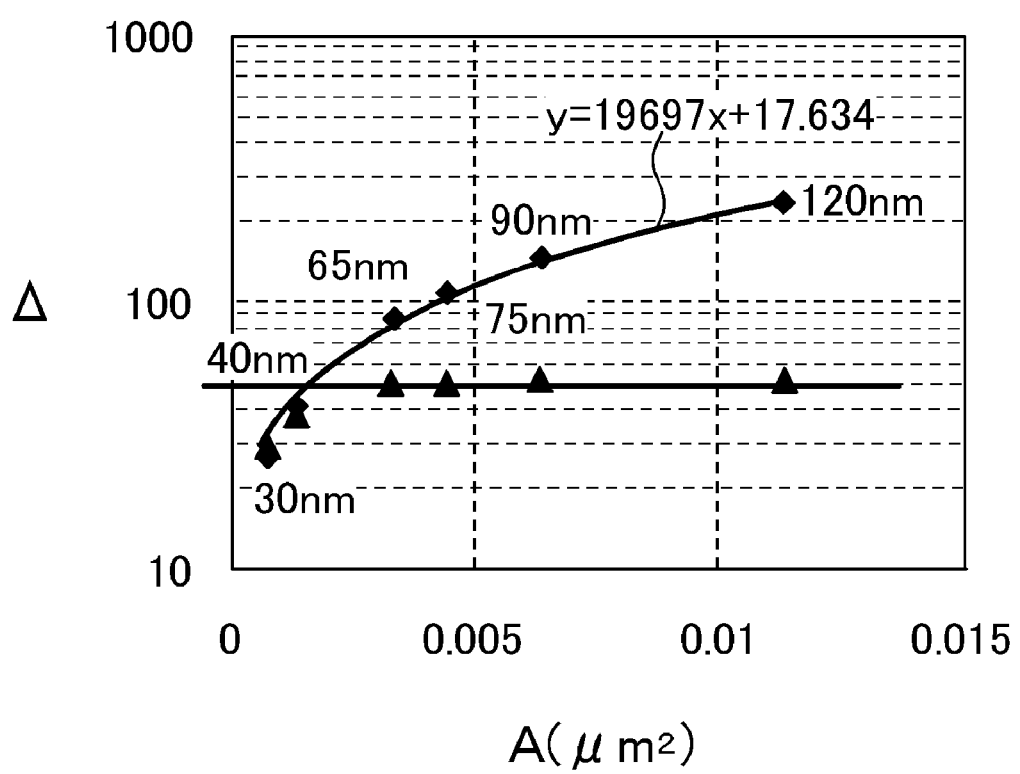
FIG. 6 is a diagram illustrating a size dependency (indicated by ▲ in the drawing) of the storage layer with respect to Δ obtained from the experiment of Sample 1 and a size dependency (indicated by ♦ in the drawing) of the storage layer with respect to Δ calculated based on saturated magnetization Ms and an anisotropy magnetic field Hk obtained through measurement of VSM.

To inspect the relation between $\Delta$ and the size of the storage layer 17 in more detail, the saturated magnetization Ms (=760 emu/cc) and the anisotropy magnetic field Hk (=2 kOe) were first inspected using VSM, and then $\Delta$ expected from the values of the matter properties was calculated using the saturated magnetization Ms, the anisotropy magnetic field Hk, and Equation 3. FIG. 6 shows a size dependency (indicated by ▲ in the drawing) of the storage layer 17 with respect to $\Delta$ obtained from the experiment of Sample 1 and a size dependency (indicated by ♦ in the drawing) of the storage layer 17 with respect to $\Delta$ calculated based on the saturated magnetization Ms and the anisotropy magnetic field Hk obtained through the measurement of VSM. From FIG. 6, it can be understood that the calculation result and the experiment result coincide with each other up to about 40 nm which is the diameter of the storage layer 17, but the calculation result and the experiment result are increasingly different from each other in the element size equal to or greater than 40 nm. In general, when a magnetic body is small, uniform (simultaneous) magnetization rotation occurs. When a magnetic body is large, uneven magnetization rotation easily occurs.

The reason why the calculation result and the experiment result are different from one another is considered to be that the state of the matter property is changed when the magnetization of the storage layer 17 is reversed from the diameter of about 40 nm. That is, when the size of the storage layer is equal to or less than the diameter of about 40 nm, the magnetization of the storage layer 17 is considered to be simultaneously rotated.

When the size of the storage layer is greater than the diameter of about 40 nm, it is considered that the magnetization of partial portions in which rotation is easy in the storage layer 17 is initially reversed and the magnetization of the remaining portions is thus reversed due to the influence of the initial magnetization. In other words, the magnetization is considered to be unevenly rotated.

When $\Delta$ is regarded to be almost uniform in the storage layer 17 of which the size is equal to or greater than the diameter of 40 nm, the element size in which $\Delta$ obtained by the calculation coincides with $\Delta$ obtained by the experiment can be known to be 45 nm from the graph of an equation of "y=19697x+17.634." This value can be considered as a value for making Ic as small as possible while $\Delta$ is ensured to be as large as possible. That is, the size of the storage layer 17 can be understood to be the diameter of 45 nm. The size of the storage layer can be converted to a volume of "1.5 nm×π× $(45/2)^2$=2390 $nm^3$."

In the storage element 3 with a size equal to or less than the diameter of 45 nm, the good balance of Δ and Ic can be said to be maintained, as expected from the calculation result, since Δ and Ic are lessened.

Accordingly, when the storage element 3 indicated by Sample 1 is formed such that the size of the storage layer 17 is equal to or less than the critical size in which the direction of the magnetization is simultaneously changed, that is, the size of the storage layer 17 is equal to or less than the diameter of 45 nm, the power consumption can be suppressed to be as small as possible. Thus, it is possible to realize the ST-MRAM using the thermal stability of the storage element 3 as much as possible.

Figure 7A:
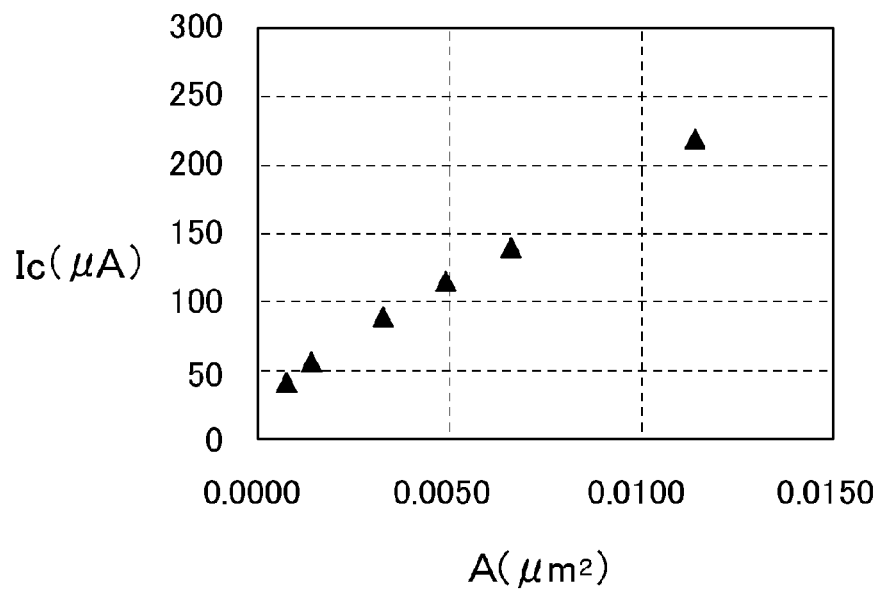
FIGS. 7A and 7B are diagrams illustrating dependencies of the size of a storage layer with respect to Ic and Δ obtained from an experiment of Sample 2.
Figure 7B:
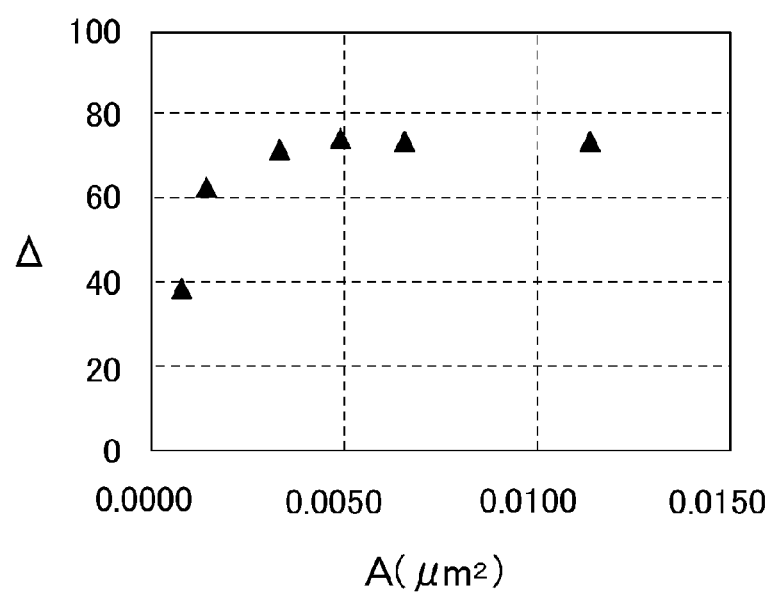
Figure 8:
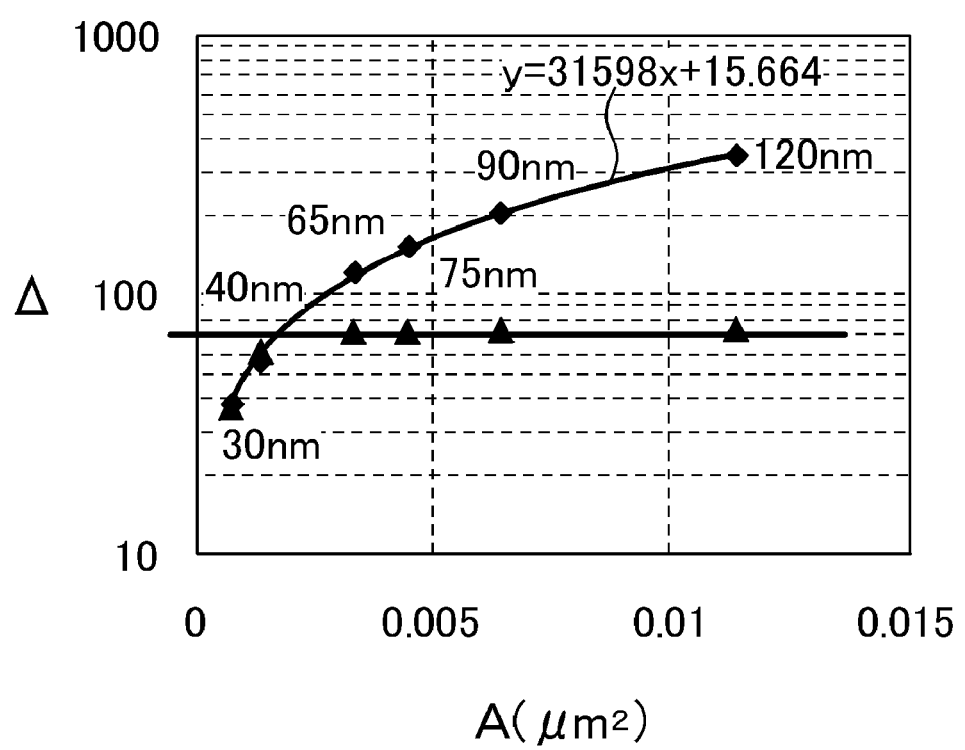
FIG. 8 is a diagram illustrating a size dependency (indicated by ▲ in the drawing) of the storage layer with respect to Δ obtained from the experiment of Sample 2 and a size dependency (indicated by ♦ in the drawing) of the storage layer with respect to Δ calculated based on saturated magnetization Ms and an anisotropy magnetic field Hk obtained through measurement of VSM.

Likewise, FIGS. 7A and 7B show the size dependency of the storage layer 17 with respect to Ic (FIG. 7A) and Δ (FIG. 7B) obtained for Sample 2 from an experiment. FIG. 8 shows a size dependency (indicated by ▲ in the drawing) of the storage layer 17 with respect to Δ obtained from the experiment of Sample 2 and a size dependency (indicated by ♦ in the drawing) of the storage layer 17 with respect to Δ calculated based on the saturated magnetization Ms and the anisotropy magnetic field Hk obtained through the measurement of VSM. In Sample 2, the saturated magnetization Ms was 650 emu/cc and the anisotropy magnetic field Hk was 2.15 kOe. In Sample 2 shown in FIGS. 7A, 7B, and 8, when the size is equal to or less than the diameter of 45 nm as in Sample 1, the power consumption can be suppressed to be as small as possible. Thus, it is possible to realize the ST-MRAM using the thermal stability of the storage element 3 as much as possible.

When the storage layer 17 is formed of Co—Fe—B or a material in which a non-magnetic material is added to Co—Fe—B and the size of the storage layer 17 is equal to or less than the critical size in which the direction of the magnetization is simultaneously changed, that is, the diameter of 45 nm, as described above, the power consumption can be suppressed to be as small as possible. Thus, it is possible to realize the ST-MRAM using the thermal stability of the storage element 3 as much as possible.

The embodiment has been described, but the present disclosure is not limited to the layer configuration of the storage element 3 according to the above-described embodiment. Various layer configurations can be realized.

For example, in the above-described embodiment, the compositions of Co—Fe—B of the storage layer 17 and the magnetization fixing layer 15 are the same as each other. The present disclosure is not limited to the above-described embodiment, but may be modified in various ways within the scope not departing from the gist of the present disclosure.

The underlying layer 14 or the cap layer 18 may be formed of a single material or may have a lamination configuration of a plurality of materials.

The magnetization fixing layer 15 may be configured by a single layer or a lamination ferri-pin structure of two layers of a ferromagnetic layer and a non-magnetic layer. Further, an antiferromagnetic layer may be added to a layer with the lamination ferri-pin structure.

Additionally, the technology of the present disclosure may also adopt configurations as below.

(1) A storage element including:
a storage layer that holds information according to a magnetization state of a magnetic body;
a magnetization fixing layer that has magnetization serving as a reference of the information stored in the storage layer; and
an insulation layer that is formed of a non-magnetic body disposed between the storage layer and the magnetization fixing layer,
wherein the information is stored by reversing the magnetization of the storage layer using spin torque magnetization reversal occurring with a current flowing in a lamination direction of a layer configuration of the storage layer, the insulation layer, and the magnetization fixing layer, and
a size of the storage layer is less than a size in which a direction of the magnetization is simultaneously changed.
(2) The storage element according to (1), wherein a ferromagnetic material of the storage layer is Co—Fe—B.
(3) The storage element according to (1), wherein a non-magnetic material is added to Co—Fe—B of the ferromagnetic material of the storage layer.
(4) The storage element according to (1), (2), or (3), wherein the storage layer and the magnetization fixing layer have magnetization perpendicular to a film surface.
(5) The storage element according to (1), (2), or (3), wherein a diameter of the storage layer is less than 45 nm.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising:
a storage layer that holds information according to a magnetization state of a magnetic body, the storage layer having a diameter of 30 nm to less than 45 nm;
a magnetization fixing layer that has magnetization serving as a reference of the information stored in the storage layer; and
an insulation layer that is formed of a non-magnetic body disposed between the storage layer and the magnetization fixing layer,
wherein the information is stored by reversing the magnetization of the storage layer using spin torque magnetization reversal occurring with a current flowing in a lamination direction of a layer configuration of the storage layer, the insulation layer, and the magnetization fixing layer, and
a size of the storage layer is less than a size in which a direction of the magnetization is simultaneously changed.

2. The storage element according to claim 1, wherein a ferromagnetic material of the storage layer is Co—Fe—B.

3. The storage element according to claim 1, wherein a non-magnetic material is added to Co—Fe—B of the ferromagnetic material of the storage layer.

4. The storage element according to claim 2, wherein the storage layer and the magnetization fixing layer have magnetization perpendicular to a film surface.

5. The storage element according to claim 1, wherein the diameter of the storage layer is about 40 nm or less.

6. A storage device comprising:
a storage element that holds information according to a magnetization state of a magnetic body; and
two kinds of lines that intersect one another,
wherein the storage element includes a storage layer that holds information according to a magnetization state of a magnetic body, the storage layer having a diameter of 30 nm to less than 45 nm, a magnetization fixing layer that has magnetization serving as a reference of the information stored in the storage layer, and an insulation layer that is formed of a non-magnetic body disposed between the storage layer and the magnetization fixing layer, in the storage element, the information is stored by reversing the magnetization of the storage layer using spin torque magnetization reversal occurring with a current flowing in a lamination direction of a layer configuration of the storage layer, the insulation layer, and the magnetization fixing layer, and a size of the storage layer is less than a size in which a direction of the magnetization is simultaneously changed, the storage element is interposed between the two kinds of lines, and the spin torque magnetization reversal occurs when the current flows in the lamination direction in the storage element via the two kinds of lines.

7. The storage device according to claim 6, wherein the diameter of the storage layer is about 40 nm or less.

* * * * *